(12) United States Patent
Fazeel et al.

(10) Patent No.: US 10,705,984 B1
(45) Date of Patent: *Jul. 7, 2020

(54) HIGH-SPEED LOW VT DRIFT RECEIVER

(71) Applicant: Cadence Design Systems, Inc., San Jose, CA (US)

(72) Inventors: H Md Shuaeb Fazeel, Bangalore (IN); Nikhil Sawarkar, Nagpur (IN); Aaron Willey, Hayward, CA (US); Thomas Evan Wilson, Laurel, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/143,123

(22) Filed: Sep. 26, 2018

(51) Int. Cl.
*G06F 13/16* (2006.01)
*H03F 3/45* (2006.01)
*G06F 30/30* (2020.01)

(52) U.S. Cl.
CPC .............. *G06F 13/16* (2013.01); *G06F 30/30* (2020.01); *H03F 3/4521* (2013.01); *H03F 3/45224* (2013.01); *H03F 2200/267* (2013.01); *H03F 2203/45022* (2013.01); *H03F 2203/45151* (2013.01); *H03F 2203/45296* (2013.01); *H03F 2203/45298* (2013.01); *H03F 2203/45374* (2013.01)

(58) Field of Classification Search
CPC ........ G06F 8/60; G06F 13/16; G06F 17/5045; G06F 30/30; H03F 2203/21106; H03F 2203/21112; H03F 2203/45022; H03F 2203/45374; H03F 2203/45296; H03F 2203/45151; H03F 2203/45298; H03F 2200/267; H03F 3/4521; H03F 3/45224; H03F 2203/7209; H03F 3/245
See application file for complete search history.

(56) References Cited

U.S. PATENT DOCUMENTS

| | | | | |
|---|---|---|---|---|
| 3,986,207 A | * | 10/1976 | Gerbel | G01D 9/28 360/6 |
| 4,222,073 A | * | 9/1980 | Hirashima | H04N 7/035 348/461 |
| 5,144,253 A | * | 9/1992 | Blanchard | C23F 13/04 204/404 |

(Continued)

OTHER PUBLICATIONS

U.S. Appl. No. 16/215,603 U.S. Pat. No. 10,545,889, filed Dec. 10, 2018, High-Speed Low VT Drift Receiver.

*Primary Examiner* — Helen Rossoshek
(74) *Attorney, Agent, or Firm* — Schwegman Lundberg & Woessner, P.A.

(57) ABSTRACT

Embodiments relate to systems, methods, and computer-readable media to enable design and creation of receiver circuitry. One embodiment is a receiver apparatus comprising a plurality of receiver arrangements, each receiver arrangement having a sampling circuit and a multi-stage differential amplifier connected to the sampling circuit. Each receiver arrangement is configurable via switches between an amplifying mode and an autozero mode. Control circuitry may select output data from a sampling circuit of one or more receiver arrangements that are not in autozero mode. In various embodiments, settings for individual receiver arrangements may be set based on decision feedback equalization (DFE).

20 Claims, 10 Drawing Sheets

(56) References Cited

U.S. PATENT DOCUMENTS

| | | | | |
|---|---|---|---|---|
| 5,337,234 A * | 8/1994 | Anderson | | E21B 47/00 702/6 |
| 6,965,262 B2 * | 11/2005 | Zerbe | | G11C 7/02 327/336 |
| 6,981,192 B2 * | 12/2005 | Panis | | G01R 31/31924 714/700 |
| 7,032,189 B2 * | 4/2006 | Upton | | H03F 3/602 716/125 |
| 7,126,408 B2 * | 10/2006 | Zerbe | | G11C 7/02 327/336 |
| 7,126,510 B2 * | 10/2006 | Alon | | H03M 1/1023 341/120 |
| 7,336,749 B2 * | 2/2008 | Garlepp | | H04L 1/20 375/355 |
| 7,675,447 B1 * | 3/2010 | Coulson | | H03M 3/494 341/143 |
| 8,068,357 B2 * | 11/2011 | Ware | | G11O 5/147 365/189.03 |
| 8,365,122 B2 * | 1/2013 | Herbst | | A61N 1/32 716/116 |
| 8,913,420 B2 * | 12/2014 | Yanni | | G06F 13/16 365/154 |
| 8,918,669 B2 * | 12/2014 | Ware | | G11C 7/225 713/500 |
| 9,533,096 B2 * | 1/2017 | Lebel | | A61N 1/37211 |
| 9,964,593 B1 * | 5/2018 | Fortin | | G01R 31/31856 |
| 10,128,965 B1 * | 11/2018 | Wilson | | H04B 17/21 |
| 10,545,889 B1 * | 1/2020 | Fazeel | | H03F 3/45183 |
| 10,545,895 B1 * | 1/2020 | Willey | | G06F 13/287 |
| 2002/0166099 A1 * | 11/2002 | Madni | | G06F 30/36 716/111 |
| 2002/0199126 A1 * | 12/2002 | Volk | | G06F 13/4072 713/401 |
| 2007/0162268 A1 * | 7/2007 | Kota | | G06F 30/33 703/14 |
| 2008/0089155 A1 * | 4/2008 | Bae | | G11C 7/1078 365/205 |
| 2012/0140780 A1 * | 6/2012 | Chang | | H04B 7/0413 370/479 |
| 2015/0049849 A1 * | 2/2015 | Chen | | G06F 1/06 375/376 |
| 2015/0077119 A1 * | 3/2015 | Li | | G01V 3/04 324/324 |
| 2016/0322997 A1 * | 11/2016 | Wloczysiak | | H03G 3/20 |
| 2019/0132428 A1 * | 5/2019 | Chalasani | | H04L 69/18 |

* cited by examiner

HIGH-SPEED LOW VT DRIFT RECEIVER

TECHNICAL FIELD

Embodiments described herein relate to electronic circuits, electronic design automation (EDA), and to associated systems, methods, devices, and instructions for generation of circuit design files. Some embodiments pertain to microprocessor interface circuits with memory devices (e.g., synchronous dynamic random access memory (SDRAM)). Some embodiments particularly relate to memory interface receivers used in memory devices.

BACKGROUND

A typical computing machine is implemented with a microprocessor, memory, and a number of other modules depending on the function to be performed by the computing machine. Double data rate (DDR) random access memory (RAM) is a particular type of RAM commonly used in current technology that performs two read accesses or two write accesses per clock cycle. Both microprocessors and DDR RAM operate on various different power supply voltages. Interface circuits that can convert between different signal levels and different drive levels are used to allow for compatible communications between microprocessors and memory devices.

EDA is a category of systems for assisting with the design of electronic systems and devices. Large, integrated circuit designs are often assembled from previously designed arrangements. This enables reduced turnaround times for generation of an integrated circuit. Schematic and layout information for such arrangement portions of a design may be exchanged or licensed as intellectual property.

DETAILED DESCRIPTION

Embodiments described herein relate to microprocessor interface circuits with memory devices, particularly memory devices configured to meet Joint Electron Device Engineering Council (JEDEC) GDDR6 standards. Interface circuits help with enhancing speed and quality of data exchange by using special techniques to handle harsh interface conditions, and embodiments described herein include innovations to meet standards while handling such condition. The embodiments described can also be used for any DDR standard and also for any other application where it can be used. The following description and the drawings illustrate specific embodiments to enable those skilled in the art to practice them. Other embodiments can incorporate structural, logical, electrical, process, and other changes. Portions and features of some embodiments can be included in, or substituted for, those of other embodiments, and are intended to cover all available equivalents of the elements described.

Some embodiments described herein relate to circuits designed in complementary metal-oxide-semiconductor (CMOS) field-effect transistors. These transistors are used in some digital integrated circuits for their simplicity, low cost, high density, and low power dissipation. Specifically, CMOS transistors only dissipate power while dynamically switching and exhibit no static power dissipation. The CMOS transistors are either of an N-type or a P-type, which refers to the doping content of the channel of the transistor. For example, an N-channel CMOS transistor produces an N-channel when the gate voltage exceeds a threshold. The N-type or N-channel transistors will be referred to as N-channel metal-oxide-semiconductor (NMOS) field-effect transistors (FETs), and the P-type or P-channel transistors will be referred to as P-channel metal-oxide-semiconductor (PMOS) FETs. Common voltages used to describe these transistors are the gate-to-source voltage ($V_{gs}$), drain-to-source voltage ($V_{ds}$), and threshold voltage ($V_t$). The current through the transistors is the drain-to-source current ($I_{ds}$). For NMOS transistors, all these values, in some embodiments, are positive, and for PMOS transistors, in some embodiments, all these values are negative. In various embodiments described herein, the PMOS voltages and current will be described in terms of absolute values. Specifically, when referring to PMOS transistors, the gate-to-source voltage will mean $|V_{gs}|$, the drain-to-source voltage will mean $|V_{ds}|$, the threshold voltage will mean $|V_t|$, and the drain-to-source current will mean $|I_{ds}|$. Anywhere herein where particular values are used, including specific values (e.g., 0 volts, 0.7 volts, etc.), it is to be understood that this is referring to a target value that operates within a variation tolerance around or approximate to the described value, where the variation is within tolerances set by the specific implementation (e.g., +/−0.05 volts, etc.).

Figure 1:
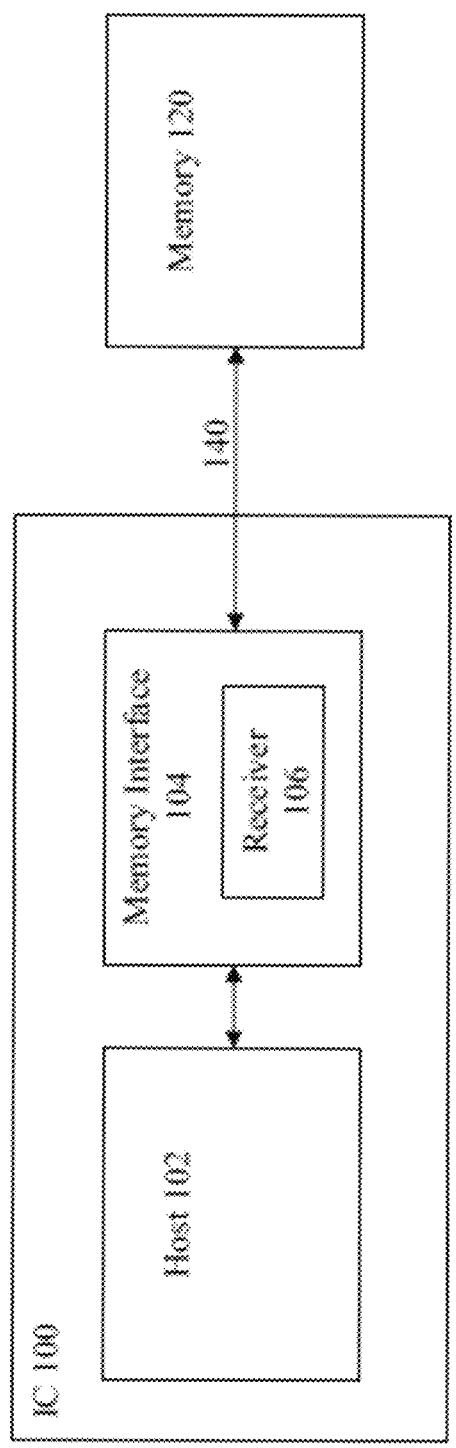
FIG. 1 illustrates the interface between a microprocessor and a memory module, in accordance with some embodiments.

FIG. 1 illustrates the interface between a microprocessor and a memory module, in accordance with some embodiments described herein. FIG. 1 particularly shows an example interface between an integrated circuit (IC) 100 and a memory module 120, in accordance with some embodiments described herein. The memory module 120 is a dynamic random access memory (DRAM) that is connected to the IC 100 by a bus 140, which can include an address bus, a data bus, read-write (R/W) signals, and a chip-enable (CE) signal, as is known to those skilled in the art. The IC 100 is an application-specific integrated circuit (ASIC) or a system on a chip (SoC). A host 102 is a microprocessor such as a central processing unit (CPU), digital signal processor (DSP), or processor core. The memory module 120 may be controlled on a system clock and can therefore be referred to as SDRAM. Embodiments of the IC 100 can include additional components to those show n in FIG. 1, but illustration thereof is omitted herein for the sake of clarity. Single data rate (SDR) SDRAM was originally built to execute one memory read access or one write access per clock cycle. On each clock cycle, an n-bit word may be transferred to or from the memory. The word length is, in some embodiments, configured in multiples of eight, and in more recent computer machines, it is common to transfer 64-bit words per clock cycle. DDR SDRAM was implemented as an improvement over SDR SDRAM and is capable of performing two read accesses or two write accesses per clock cycle. This is accomplished by performing one access on the rising edge of the clock and one access on the falling edge of the clock. In this manner, the data transfer rate is doubled by transferring two 64-bit words per clock cycle. The standard protocols for operating DDR SDRAM are defined by JEDEC (e.g., DDR2, DDR5, GDDR6, etc.)

The operation of the host 102 involves the execution of programs that are loaded into the memory module 120 so as to create, edit, and delete data that is also stored in the memory module 120 or other devices. Specifically, each microprocessor operation involves a fetch and execute cycle where an instruction is read from the memory module 120, decoded by the host 102, and executed. Also, the execution of the instruction often involves a data read from or a data write to the memory module 120. Each of these instruction cycles is performed synchronously to a system clock, with the duration of the instruction cycle being between one or more clock cycles. In some embodiments, the duration is specifically limited to a set number of cycles between one and three clock cycles. In other embodiments, the duration may be more than three clock cycles.

More particularly, during a read operation, the host 102 indicates the address location from which data from the memory module 120 is to be read. A memory interface 104 is responsible for indicating the address on the address bus, floating the data bus (high-Z or high-impedance state), and asserting the CE and R/W signals for a read operation. Then the memory module 120 places the data from the memory location indicated by the address bus onto the data bus. The memory interface 104 then reads the data from the data bus. More particularly, a receiver 106 converts the data signals from the memory module 120 to the voltage levels needed by the host 102, and the read operation is complete. In this regard, memory types such as DDR4 typically operate between a VDDQ=1.32 Volt supply voltage down to a VDDQ=1.08 Volt supply voltage, while current microprocessor cores operate with a power supply voltage as low as VDD=0.65 Volts. The microprocessor supply voltage, core supply voltage, or signal supply voltage will be referred to herein as VDD, while the memory supply voltage or I/O supply voltage will be referred to as VDDQ.

DDR interface receivers such as the receiver 106 are commonly DC coupled to external signaling for communicating with the memory module 120. This is in part due to power constraints as well as design complexity. However, the present applicant recognizes that current state-of-the-art DRAM protocols have increasingly challenged receiver designs with higher bandwidth needs, low-power needs, wide input common mode ranges, and introduction of channel equalization techniques. Among other things, the present applicant recognizes that DC-coupled receiver architectures typically have less than desirable power and or performance tradeoffs which may negatively affect system designs.

Accordingly, among other things, the present embodiments provide an AC-coupled receiver architecture. This AC-coupled differential receiver architecture can operate over a full input common mode range (i.e., from ground to VDDQ) and can amplify input signals at speeds up to or exceeding 18 Gbps. Additionally, the receiver architecture of the present embodiments includes an autozeroing functionality (i.e., the receiver is a differential autozeroing receiver (DAZR)). Among other things, this autozeroing functionality aims to null out (e.g. compensate for) any input-referred mismatch in the differential amplifiers. More particularly, the present applicant recognizes that due to strict area, bandwidth, and power specifications of DDR receivers, a non-trivial amount of input-referred mismatch is present. This mismatch should be zeroed out through calibration to achieve an acceptable setup/hold margin. Additional aspects of autozero operations compatible with the receiver circuitry described herein are discussed below.

Figure 2:
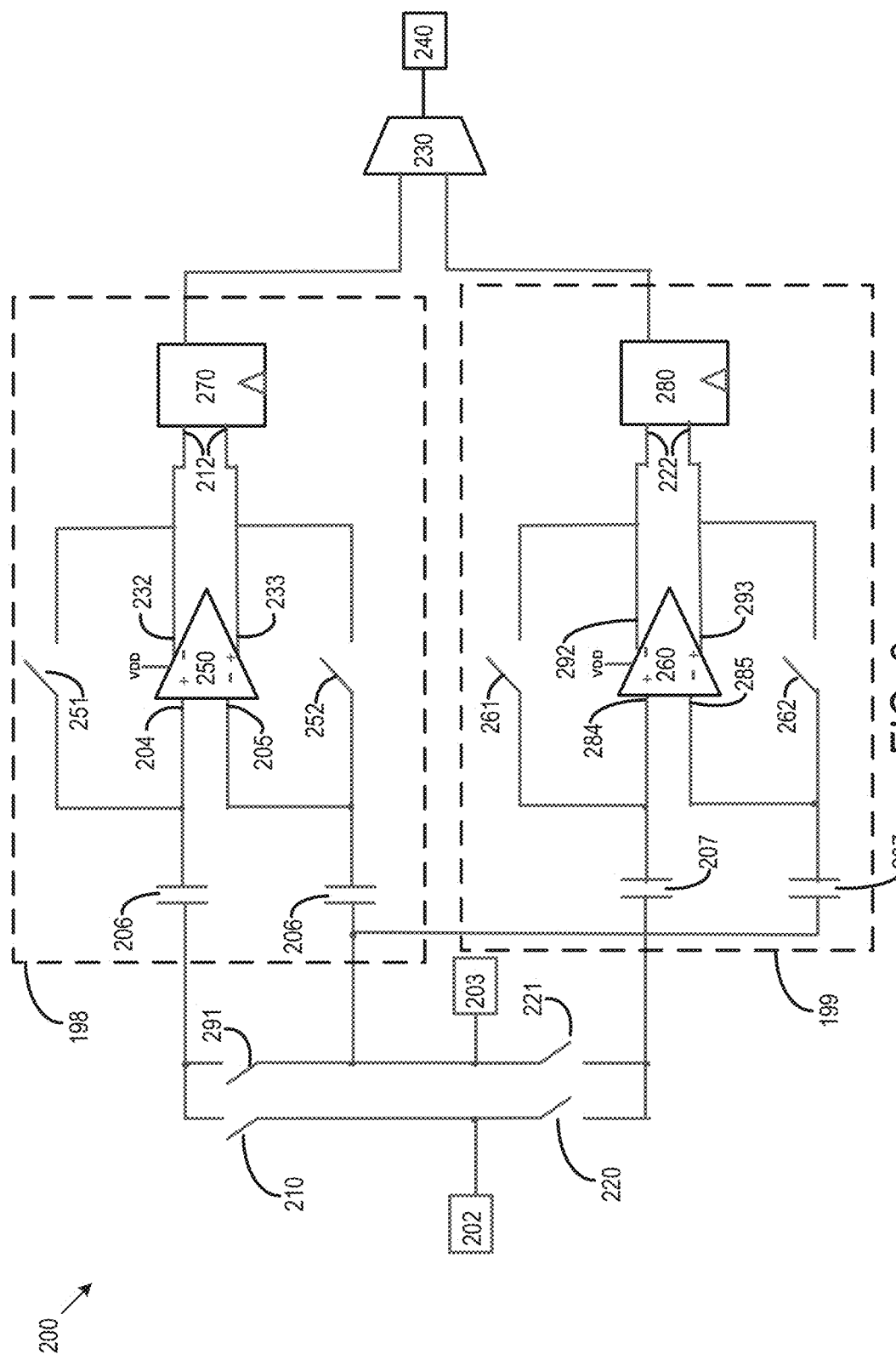
FIG. 2 illustrates aspects of an example circuit implementation of a receiver, in accordance with some embodiments.

FIG. 2 illustrates aspects of an example circuit implementation of a receiver 200, in accordance with some embodiments. The architecture illustrated for receiving one bit of data from memory as part of a datastream can be replicated based on the word size used in a particular application. Those skilled in the art of memory interfaces will understand how to adapt a receiver for a memory interface circuit (i.e., memory controller and/or physical layer (PHY)) with the DAZR functionality as part of a JEDEC-compliant memory receiver of the present embodiments after being taught by the following embodiments. The receiver architecture of the present embodiments is not necessarily limited to a memory interface circuit on a separate chip or die from a memory chip or die. For example, the receiver architecture could be placed on a memory die and be connected to a memory controller PHY.

The receiver 200 in this example includes an input terminal 202, an output terminal 240, and a voltage reference terminal 203. As described in more detail below, some embodiments may include multiple voltage reference terminals for different receiver arrangements (e.g. receiver blocks). The embodiment of the receiver 200 includes a single voltage reference terminal that is shared by receiver arrangements 198 and 199. In general, the receiver 200 provides an amplified output at the output terminal 240 based on the data provided from DDR memory at the input terminal 202 (e.g., one bit of data as part of a stream of data received at the input terminal 202). A voltage provided at the voltage reference terminal 203 is a reference voltage that is used for detecting whether a data bit received at the input terminal 202 is a logic "1" or a "0" and effectively represents the input common mode level of the circuit. In one example embodiment, the reference voltage is generated on the integrated circuit and is configurable. In some embodiments, the reference voltage (or voltages for multiple voltage reference terminals) may be adjusted as part of decision feedback equalization (DFE) to reduce errors in determining whether the input bit is a logic "1" or "0."

The receiver 200, according to embodiments, includes duplicate receiver paths through a first receiver arrangement 198 and a second receiver arrangement 199. As shown, the example receiver 200 includes duplicate differential amplifiers 250 and 260 in respective receiver arrangements 198 and 199.

When a switch 210 is closed and a switch 291 is open, the amplifier 250 receives a differential input signal from the input terminal 202 and the voltage reference terminal 203 at a first input 204 and a second input 205 via input capacitors 206 (e.g. reference capacitors), and outputs an amplified differential signal at a first output 232 and a second output 233. The output signal from the amplifier 250 is provided to a sampler 270 at input(s) 212. Similarly, when a switch 220 is closed and a switch 221 is open, the amplifier 260 receives a differential input signal from the input terminal 202 and the voltage reference terminal 203 at a first input 284 and a second input 285 via the input capacitors 207 and outputs an amplified differential signal at a first output 292 and a second output 293. The output from the amplifier 260 is provided to a sampler 280 at input(s) 222.

The signal from the input terminal 202 (e.g., one bit of data from memory) can be selectively provided via the input capacitors 206 or 207 to either or both of the receiver arrangements 198 and 199 by opening the switches 210 and 220, and closing the switches 291, and 221. These switches, which may be controlled by signals that are used to control an autozeroing operation for the amplifiers 250 and 260, respectively, as will be described more fully below. When switches 251, 252, and 291 are closed and switch 210 is opened, the input terminals and output terminals for the amplifiers 250 are coupled to the voltage reference terminal 203 via input capacitors 206. When switches 261, 262, and 221 and switch 220 is opened, input and output terminals for amplifier 260 are coupled to the voltage reference terminal 203 via input capacitors 207. Additional switches internal to the amplifiers 250 and 260 may also operate during autozero operations to maintain the stability of the amplifiers as discussed in more detail below, particularly with respect to FIG. 4.

In autozero mode, the offset of each receiver arrangement (e.g., sub-receiver) is stored in its respective input capacitors 206 or 207. The capacitors 206 and 207 decouple the input common mode from the receiver amplifier common mode. In this way, the input common mode can be at a high voltage (e.g., near VDDQ or VDD), while the amplifier can run at a different voltage (e.g., a lower voltage or a voltage near ground).

A Mux 230 selects an output signal from either the sampler 270 or the sampler 280 for output to the output terminal 240 based on an input selection signal to the Mux 230. In one possible example, when the MUX signal is "high" or logic "1," the Mux 230 selects the signal from the sampler 270 for output to the output terminal 240, and when the MUX signal is "low" or logic "0," the Mux 230 selects the signal from the sampler 280 for output to the output terminal 240. In some embodiments, the Mux 230 outputs a CMOS-level signal which is input to a flip-flop which is clocked by a strobe signal. Selection of data by the Mux 230 after the samplers 270 and 280 avoids timing errors in the critical eye window. The samplers 270 and 280 may have associated deadbands or timing errors. This may be handled by having sufficient eye height at the differential amplifier output for each receiver arrangement. In still further embodiments, the deadband of each sampler is compensated for or reduced by having offset controls in each sampler and calibrating them during device initialization. In some embodiments, the MUX 230 can be placed with its inputs being the output of the differential amplifiers 250 and 260. The MUX 230 can then select either the output of differential amplifier 250 or 260 and the MUX 230 output can then be input to sampler 270 which is connected directly to output terminal 240.

Figure 3:
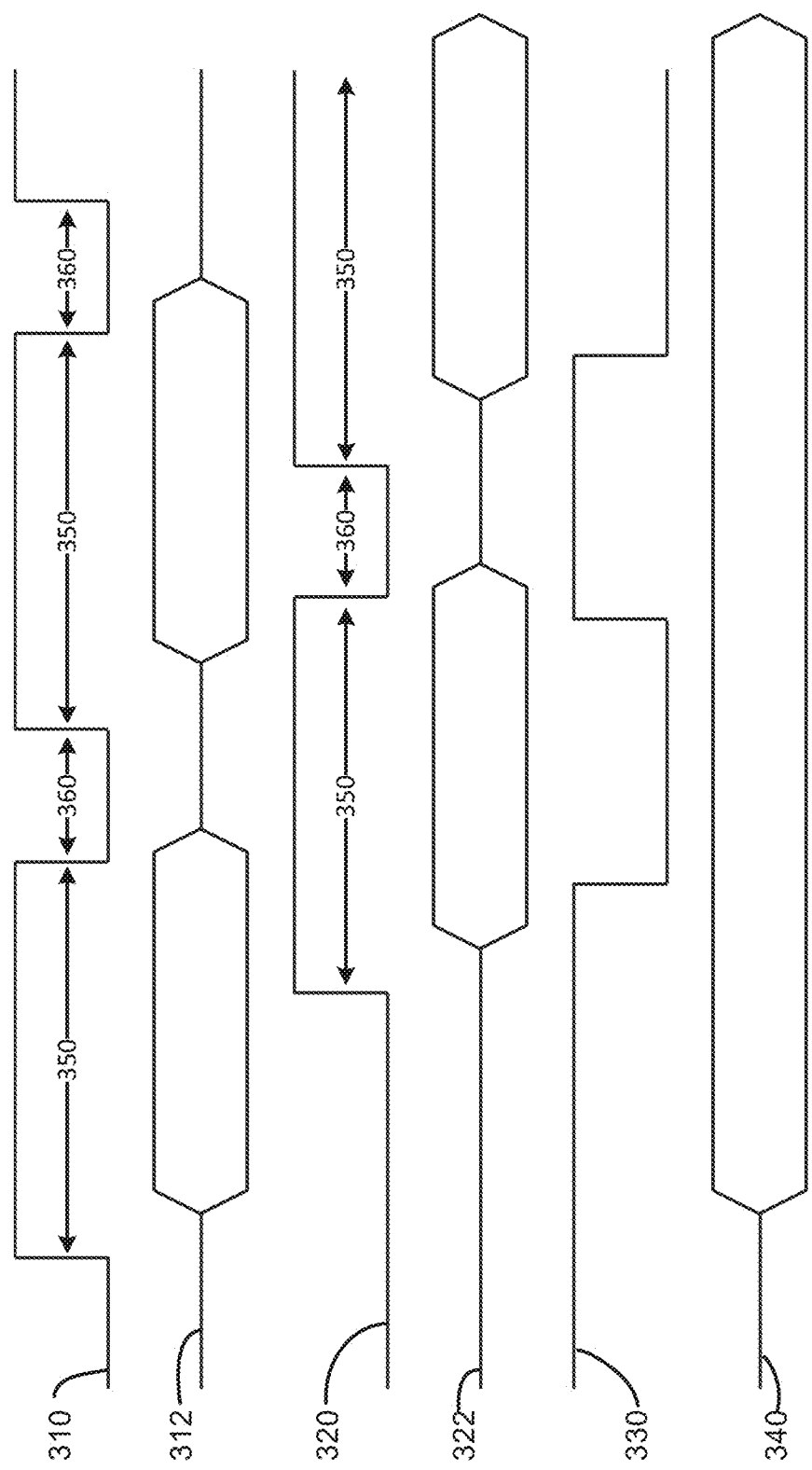
FIG. 3 illustrates aspects of receiver circuit operation, in accordance with some embodiments.

FIG. 3 illustrates aspects of receiver circuit operation, in accordance with some embodiments. FIG. 3 shows operation of the receiver 200 or another receiver in accordance with some embodiments described herein. A signal 310 describes an operating state for the receiver arrangement 198, with a high signal level indicating a signal amplifying mode 350, and a low signal level indicating an autozero mode 360. A signal 312 represents the output of the sampler 270. During the signal amplifying mode 350, the switch 210 is closed, and the switches 291, 251, and 252 are open, and the sampler 270 outputs data During the autozero mode 360, the switches reverse, with the switch 210 open, and the switches 291, 251, and 252 closed, and the sampler 270 outputs no data (e.g., all 0s or all the same state). The same cycle of autozero operation and amplifying operation is present for the receiver arrangement 199, with a signal 320 indicating the state of the receiver arrangement 199 and a signal 322 representing the output of the sampler 280. A signal 330 represents which input of the Mux 230 is selected at a given time, and a signal 340 indicates the data at the output terminal 240. As may be seen, during transitions from amplifying to autozero operation, individual receiver arrangements may not provide data at the output of the arrangement, and so the periodic cycle of autozeroing and amplifying for each arrangement may be structured to ensure that one receiver arrangement is always in a consistent amplifying mode. In one embodiment, each bit is on an approximately 55-picosecond (ps) cycle, and the receiver arrangements autozero on a 10-nanosecond (ns) cycle, such that each receiver arrangement enters an autozero mode 360 even 10 nanoseconds, or roughly once every 180 bits.

In various embodiments, any number of receiver arrangements may be included in a single receiver embodiment, with a Mux to select between the receiver arrangements. This allows not only for selection of a receiver arrangement that is not operating in an autozero mode, but also for selection of a receiver arrangement with DFE settings to reduce bit decision errors. For example, as detailed further below, each arrangement may have programmable resistors or capacitors which are used to modify the receiver arrangement operation, and analysis of recent bit decisions may be used to select data from a receiver arrangement based on the settings of the programmable elements (e.g., capacitors or resistors). Similarly, in some embodiments, each receiver arrangement may be attached to a different voltage reference terminal (e.g., instead of a single voltage reference terminal 203). In addition to cycling through receiver arrangements for autozero operations, for receivers with more than two receiver arrangements, control circuitry may select between the receiver arrangements that are not in autozero operations based on DFE considerations of different reference voltages of the different receiver arrangements, or based on DFE considerations of different settings of programmable elements. Thus, in some embodiments, a reference voltage may be set based on DFE sensing of previous bits, and a particular receiver arrangement with a programmed reference voltage selected as part of DFE operations.

Receiver devices such as the receiver 200 operate as part of a system memory to achieve higher bandwidth per pin for applications such as data servers, artificial intelligence, high-speed graphics, machine learning, or other such applications by meeting JEDEC GDDR6 protocols in memory applications with speeds up to 18 gigabits per second (Gbps). In some embodiments, memory applications supported may be higher than 18 Gbps. These standards may be met by system on a chip (SOC) physical layer (PHY) designs using the receiver 200 with appropriate circuit elements designs. Additionally, the JEDEC GDDR6 protocols do not have provision for periodic calibration or live data calibration updates because there is no guarantee of read activity or transitions, and thus have tight drift specifications to be met by the receiver. Further, GDDR6 protocols use signaling at or near power voltages, and thus compatible receiver designs are capable of receiving high-voltage (e.g., near the power voltage) signals at the input. The specifications of JEDEC GDDR6 thus call for a high-speed low-voltage and temperature (VT) drift receiver with low power and good timing margins, such as the receiver 200. As part of such compliance, the receiver 200 may operate at frequencies up to 18 Gbps or higher in a 7-nanometer (nm) node.

To meet the operating standards of GDDR6, embodiments described herein may use low-voltage cascaded differential amplifiers for the amplifiers 250 and 260 with bandwidth enhanced by introducing zeros in the transfer function. In some embodiments, the amplifier in the receiver is built from cascaded resistive load stages, with the first stage having continuous time linear equalization (CTLE) for channel response, and one or more subsequent stages having a source degenerated impedance to introduce zero in the transfer function and enhance the bandwidth. The number of stages in the multi-stage differential amplifiers for each receiver arrangement (e.g., receiver arrangements 198 and 199, or additional arrangements in other embodiments) depends on the technology node (e.g., 7 nm, 10 nm, etc.), with higher technology nodes needing more stages. In some embodiments with two or three stages, Miller compensation is used to keep the amplifier stable in autozero mode, with Miller capacitors connected during the autozero mode and disconnected during the amplifying mode. In some embodiments with three or more stages, nested Miller compensation may be used. Some embodiments may operate with one receiver arrangement operating as a parallel calibration receiver which is swapped periodically with the main receiver and the DFE unrolled tap receivers. A level-shifting capacitor is used in some embodiments to handle the down-level shifting of high-voltage input signals to low-voltage outputs (e.g., the input capacitors 206). Such capacitors may also be used to autozero the differential amplifier and store an offset during the autozero phase. Within each amplifier, one or more Miller compensation capacitors may be connected with switches during the autozero phase to keep the amplifier loop stable, and nested Miller compensation capacitors may be connected when three or more stages are used for a multi-stage differential amplifier.

Figure 4:
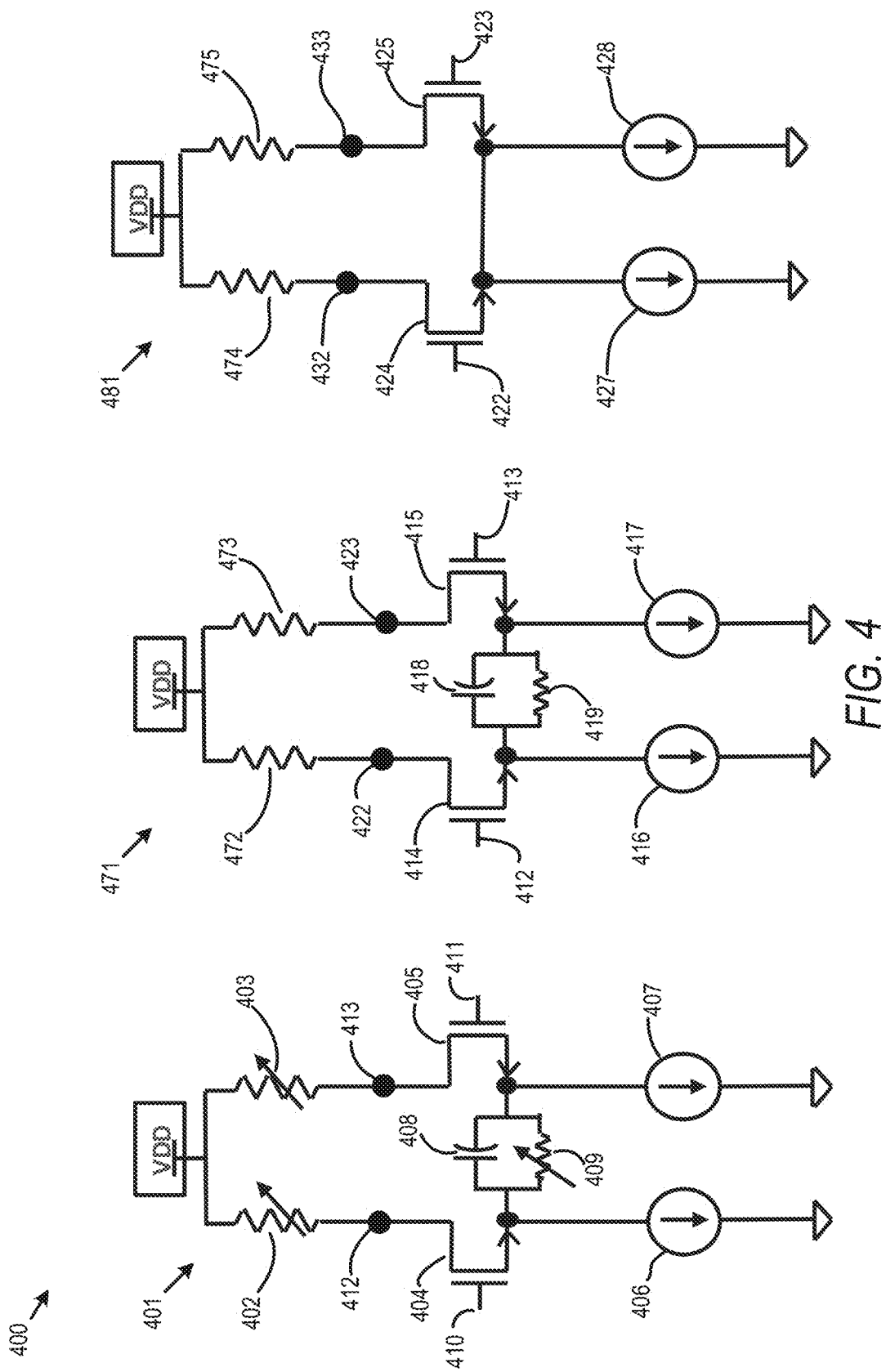
FIG. 4 illustrates aspects of an example multi-stage differential amplifier for use in a receiver apparatus, in accordance with some embodiments.

FIG. 4 illustrates aspects of an example multi-stage differential amplifier 400 for use in a receiver apparatus (e.g., the receiver 200) in accordance with some embodiments. In the embodiment of FIG. 2, for example, the amplifier 40X) may be used for both amplifiers 250 and 260. In other embodiments, other similar amplifiers may be used, such as an amplifier with additional stages (e.g., four, five, or more stages instead of the three stages of the amplifier 400). The amplifier 400 includes multiple amplifier stages, shown as an initial or first stage 401, an intermediate stage 471, and an output stage 481. Additional embodiments may include multiple intermediate stages, or other configurations. Each stage of the amplifier 400 in the embodiment of FIG. 4 is a low-voltage differential amplifier, and the stages are cascaded together, such that the inputs of the intermediate and output stages are connected to the outputs of the previous respective stages.

Each stage includes two field-effect transistors (FETs). The first stage 401 includes FETs 404 and 405. Gates 410 and 411 of the respective FETs 404 and 405 are the inputs to the amplifier 400 (e.g., first and second inputs 204 and 205 or 284 and 285). The sources of the FETs 404 and 405 are connected to ground by current sources 406 and 407, and may connected to each other by a capacitor 408 and a programmable resistor 409. Some embodiments may not include capacitor 408 and resistor 409. The drains of the FETs 404 and 405 operate as the outputs of the first stage 401, and are directly connected to the inputs of the next stage, as shown by nodes 412 and 413 (e.g., the differential output of the first stage 401 and the differential input of the intermediate stage 471). The drains of the FETs 404 and 405 are further connected to the power voltage (VDD) via programmable resistors 402 and 403. The resistors 402 and 403 may be programmable resistors or resistors with fixed value."

The intermediate stage 471 is essentially a duplicate of the first stage 401 without the programmable elements. The intermediate stage 471 includes FETs 414 and 415 with sources connected to ground by current sources 416 and 417 and may be connected to each other via a capacitor 418 and a resistor 419. The drains (e.g., at nodes 422 and 423) are connected to VDD via resistors 472 and 473, and to the gates of the next stage.

In the output stage 481, FETs 424 and 425 have sources that are directly connected to each other, and connected to ground via one or more current sources (shown as current sources 427 and 428). The drains are connected to VDD via resistors 474 and 475. Nodes 432 and 433 at the drains of the FETs 424 and 425 are the differential output of the amplifier 400 (e.g., outputs 232 and 233 or 292 and 293). In some embodiments the sources of FETs 424 and 425 may be connected to each other via a capacitor and resistor.

In the amplifier 400, zeros (e.g., the capacitor 418 and the resistor 419) are introduced to enhance the bandwidth. In various embodiments of a multi-stage differential amplifier in accordance with the embodiments described herein, one or more such zeros may be added by source degeneration resistor/capacitors (RC) in the stages to improve performance. Various embodiments may have different combinations of such zeros in different stages. Additionally, in some embodiments, programmable elements (e.g., resistors 402, 403, and 409) may use different settings for DFE offsets or for continuous time linear equalization (CTLE). As described above, for receivers with three or more receiver arrangements, different settings may be used for DFE feedback. In some embodiments, control circuitry may set the values of resistors (e.g., 402, 403, and 409) as part of DFE operation, or select a particular receiver arrangement from among multiple receiver arrangements not in autozero operation based on resistor settings in the amplifier. In various embodiments of a multi-stage differential amplifier in accordance with the embodiments described herein, the arrangement of the different stages may be interchanged. For example, the programmable resistor 409 and programmable capacitor 408 may be placed in second stage 471 instead of first stage 401.

As seen in FIG. 2 and described above, when the switches are set for autozero operation, the outputs of an amplifier are connected to the inputs, and the inputs are connected together at a reference voltage. Such connections may cause the amplifier operation to become unstable, which may prevent the amplifier from settling into the normal data output when changing from the autozero mode 360 to the signal amplifying mode 350. As illustrated by FIG. 3, some settling time may occur during these transitions, but if an amplifier is unstable, this may interfere with data output in the signal amplifying mode 350. Miller capacitors may be introduced to address this issue as shown in FIG. 5.

Figure 5:
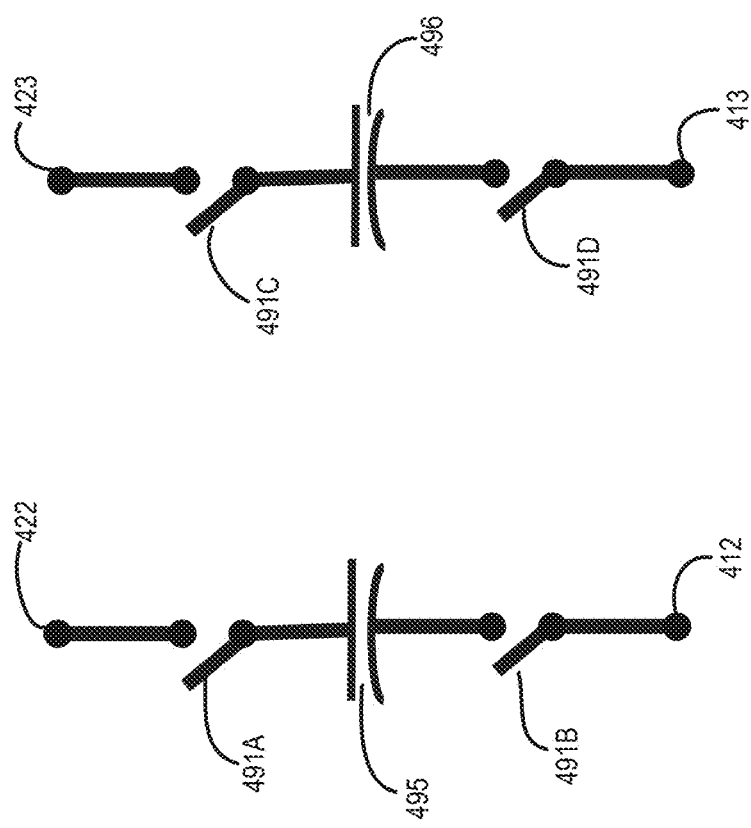
FIG. 5 illustrates aspects of an example multi-stage differential amplifier for use in a receiver apparatus, in accordance with some embodiments.

FIG. 5 illustrates aspects of an example multi-stage differential amplifier for use in a receiver apparatus in accordance with some embodiments. In particular, FIG. 5 shows two Miller capacitors 495 and 496 which may be included into the amplifier 400 via switches 491A-D. In the embodiment of FIG. 5, the capacitor 495 is connected between the node 410 (e.g., a first input to the first stage 401) and the node 422 (e.g., a first output of the intermediate stage 471), and the capacitor 496 is connected between the node 411 (e.g., a second input to the first stage 401) and the node 423 (e.g., a second output of the intermediate stage 471). In various embodiments, these capacitors may be configured to connect the outputs and inputs of any stages to reduce instability during the autozero mode.

While FIGS. 4 and 5 illustrate three stages with two Miller capacitors in a particular format, other formats and stages may be used. For example, in another three-stage embodiment, other connections between inputs and outputs of stages may be used than those of FIG. 5. In one embodiment of a four-stage amplifier, with an input and output stage similar to those of FIG. 4, and two intermediate stages similar to the intermediate stage 471, four Miller capacitors may be used. In one such embodiment, a first output node of the output stage is connected to both a first output of the second stage (e.g., first intermediate stage) and to a first output of the third stage (e.g., a second intermediate stage). The second output node of the output stage is similarly connected to the second outputs of the two intermediate stages. In other embodiments, other such combinations of nested Miller capacitors may be added depending on gain configurations, with associated switches to connect the capacitors during autozero operations and disconnect the capacitors during amplifying operations.

Figure 6:
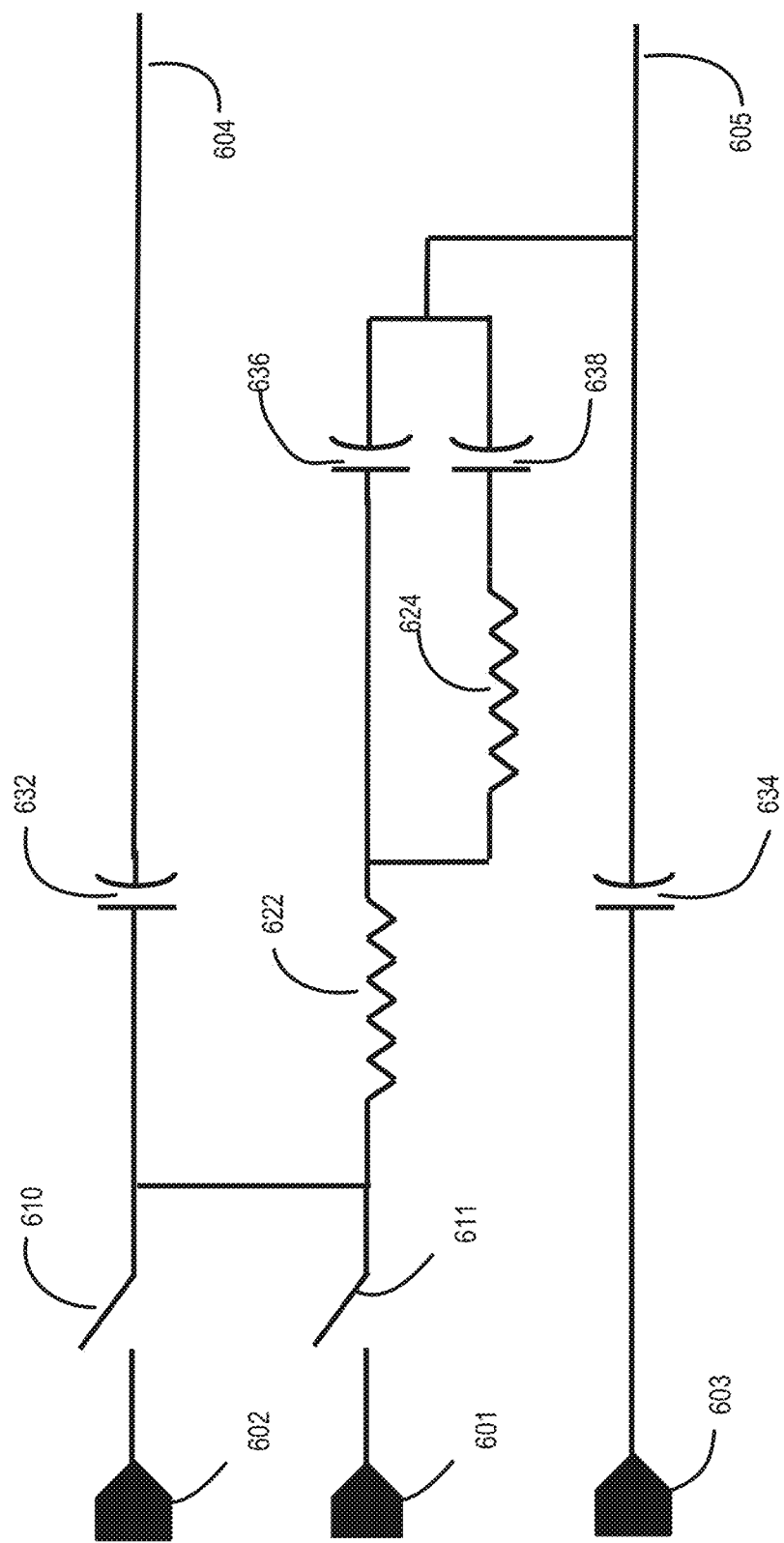
FIG. 6 illustrates aspects of an example circuit implementation of a receiver, in accordance with some embodiments.

FIG. 6 illustrates aspects of an example circuit implementation of a receiver, in accordance with some embodiments. In some embodiments, an additional input RC structure is used to introduce two zeros near the receiver bandwidth with a pole at a high frequency relative to the zeros. FIG. 6 illustrates such a structure, with an input node 602 connected to the input terminal 202, an input node 601 and an input node 603 connected to the voltage reference terminal 203. A switch 610 is the same as the switch 210 in such an embodiment, and connects the input node 602 to a first input 604 (e.g., the first input 204 of the amplifier 250) via a capacitor 632 (e.g., one of the input capacitors 206). Similarly, the input node 603 is connected to an input terminal 605 (e.g., the second input 205 of the amplifier 250) via a capacitor 634 (e.g., one of the input capacitors 206). Switch 611 is the same as switch 291, and connects the input node 601 to the first input 604. The second-order RC structure with resistors 622 and 624, and capacitors 636 and 638, connects the input terminal 605 to the input node 602 via the switch 610. The switch 610 is open during autozero operation, and closed during amplifying operation. Conversely, switch 611 is closed during autozero operation and open during amplifying operation.

In some embodiments, the circuit of FIG. 6 is configured to introduce two additional zeros into the overall amplifier operation. The additional zeros may effectively cancel poles introduced by the switch 610 along with various resistive loads, capacitances at internal nodes, and load capacitances of sampler inputs. The poles arising due to the introduction of zeros are designed to be at a higher frequency than the receiver bandwidth by choosing appropriate values of resistances and capacitances to enable operation of the receiver in accordance with JEDEC GDDR6 operation.

Figure 7:
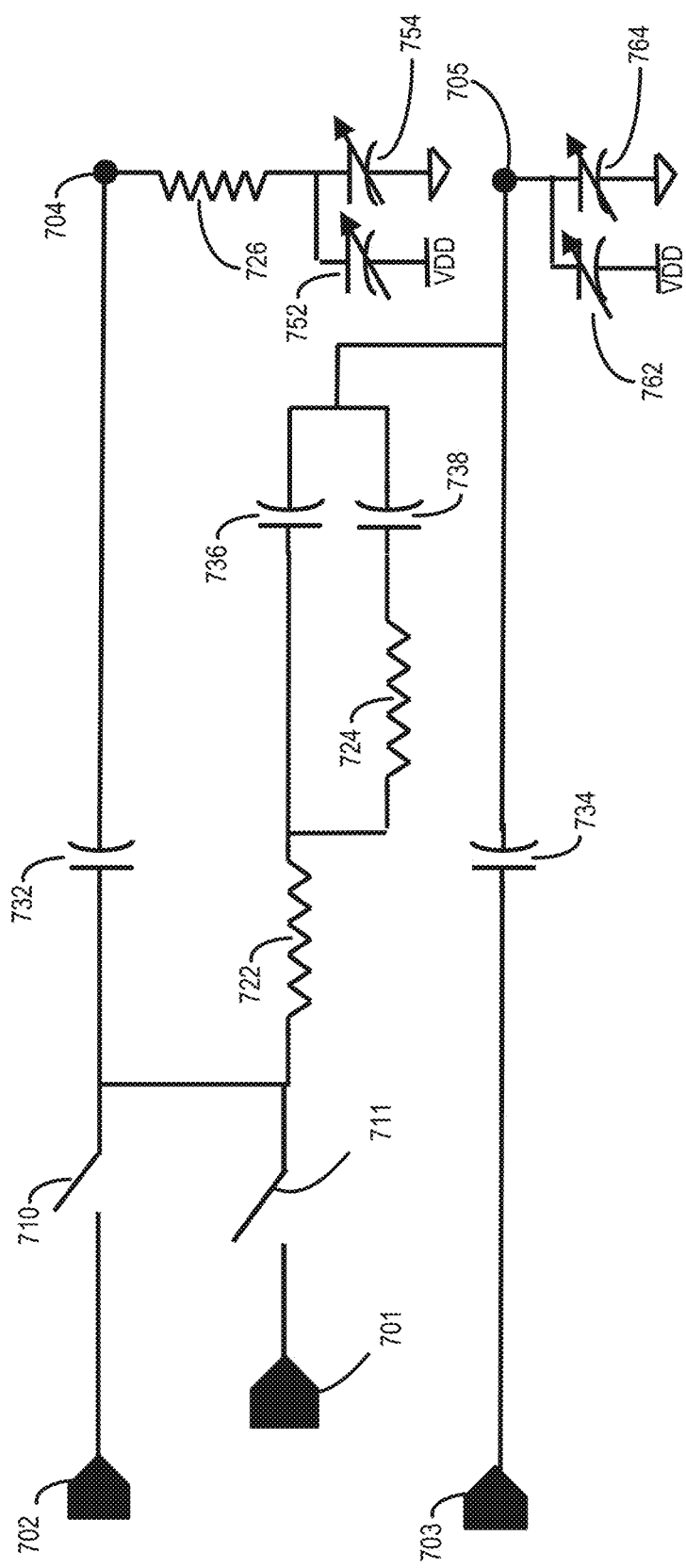
FIG. 7 illustrates aspects of an example circuit implementation of a receiver, in accordance with some embodiments.

FIG. 7 illustrates aspects of an example circuit implementation of a receiver, in accordance with some embodiments. The circuit of FIG. 7 is similar to the circuit of FIG. 6, but with programmable elements added for use with DFE and potentially to enhance the frequency response of a receiver arrangement. FIG. 7 includes an input node 702 connected to the input terminal 202, input node 701 connected to voltage reference terminal 203, and an input node 703 connected to the voltage reference terminal 203. A switch 710 is the same as the switch 210 in such an embodiment, and connects the input node 702 to a first input 704 (e.g., the first input 204 of the amplifier 250) via a capacitor 732 (e.g., one of the input capacitors 206). Similarly, the input node 703 is connected to an input terminal 705 (e.g., the second input 205 of the amplifier 250) via a capacitor 734 (e.g., one of the input capacitors 206). The second-order RC structure with resistors 722 and 724, and capacitors 736 and 738, connects the input terminal 705 to the input node 702 via the switch 710. The switch 710 is open during autozero operation, and closed during amplifying operation.

Additionally, the circuit of FIG. 7 includes a resistor 726, and programmable capacitors 752, 754, 762, and 764. Some embodiments may operate without a resistor 726. In some embodiments, the programmable DFE capacitors of FIG. 7 are physically small compared to the programmable resistors of FIG. 4, and save layout area spent on programmable resistance elements. These programmable capacitor elements of FIG. 7 may be set to adjust a DFE offset for an individual receiver arrangement. As described above, different receiver arrangements may be programmed with different values, and control circuitry may set the capacitor values or select a particular stage which is not in autozero mode based on the capacitor values as part of DFE operation. The selected stage may then be used until the selected stage is scheduled for a periodic autozero operation or until DFE feedback indicates that different values are to be used, whichever occurs sooner. The receiver then switches to data from a different receiver arrangement not operating in autozero mode with the appropriately configured programmable capacitor settings. In some embodiments, the resistor 726 is optional (e.g., may be near zero). In other embodiments, the resistor 726 is selected to introduce a zero with the programmable capacitors 752 and 754 to enhance the frequency response of the amplifier connected to the first input 704. With the programmable capacitor DFE offset, using the programmable adjustment introduces capacitance in series with the inputs to the switch and may cause inter-symbol interference. This can be reduced with the appropriate value for the resistor 726.

Thus, as described above, embodiments include a receiver apparatus with two or more sub-receivers (e.g., receiver arrangements). If the receiver apparatus is implementing unrolled DFE, the apparatus will include one or more additional sub-receivers (e.g., three or more receiver arrangements total). A one-tap unrolled DFE receiver will have three receiver arrangements, and a two-tap unrolled DFE receiver will have two additional receiver arrangements for a total of five receiver arrangements. Each receiver arrangement will periodically be placed in an autozero mode to combat VT drift or other such issues.

For basic receiver operation (e.g., a zero-tap receiver with two receiver arrangements total), the receiver arrangements alternate between an autozero mode and an amplifying mode. During the amplifying mode, all odd and even or I/Q data is connected through the amplifying receiver arrangement. During autozero mode, the data is not passed through a receiver arrangement, and the receiver relies on another receiver arrangement. A Mux accepts the outputs of all receiver arrangements, and selects the output with data (e.g., from the receiver arrangement in amplifying mode). Since selection of data between the different receiver arrangements happens after the input data has been sampled once, the error introduced at the sampler by switching between receivers does not affect the timing margin.

When unrolled DFE is implemented with one or more taps, the extra receivers are swapped one by one into autozero mode. DFE may be implemented in one or more ways, as described above. For example, as detailed above, in some embodiments different reference voltages which are programmable may be used for each receiver arrangement. In some embodiments, programmable elements in an input stage of an amplifier may be set for DFE (e.g., resistors 402 and 403). In some embodiments, programmable elements as part of an input capacitance structure (e.g., capacitors 752, 754, 762, and 764) may be set as part of DFE. In some embodiments, any combination of the above DFE mechanisms may be used to provide feedback from previous bits for the decision threshold of an individual receiver arrangement.

In one particular embodiment, DFE offset can be introduced, as with different reference voltage (VREF) values. In such an embodiment, the backup sub-receiver (e.g., receiver arrangement) will have its VREF switched to the VREF of the particular receiver that it is replacing. For instance, if one-tap DFE is implemented (decision feedback equalization based on one previous bit), then three sub-receivers are needed, two for two values of VREF and one as a backup receiver. The backup receiver will replace the other two receivers periodically and in sequence. The sequence can be as follows: step 1 Initialization—all three receivers are put in autozero mode; step 2—receiver 1 and receiver 2 are in operation mode with VREF1 and VREF2 as input VREF, and backup receiver 3 is put in autozero mode: step 3—receiver 3 replaces receiver 1 and its VREF is VREF1, receiver 1 is put in autozero mode, and receiver 2 is in normal operation: step 4—receiver 3 is put in autozero mode, and receiver 1 and 2 are in normal operation: step 5—receiver 3 replaces receiver 2 and its VREF is set to VREF2, receiver 2 is put in autozero mode, and receiver 1 is in normal operation; and step 6—back to step 2. Step 2 to step 6 are repeated continuously as long as the receiver is operating. This can be extended to n-tap DFE with multiple receivers with multiple VREFs for more taps. Similar operations may be used with the programmable resistor or capacitor embodiments described above, with different offset codes for the resistors or capacitors. The offset codes of the receiver can be varied at the speed of data for DFE. A combination of these three methods (e.g., VREF adjustment, resistor adjustment, and capacitor adjustment) can be used to introduce DFE offset for n-tap DFE.

Because the embodiments described herein have no VT-dependent offset codes or settings, and rely on autozero mode operations, the receiver operates with low VT drift. Eye height of the output data may be improved in various different embodiments with DFE and CTLE as described herein.

In various embodiments, aspects of the circuitry are implemented differently, including structures with a digital signal processor, a programmable logic device, a field-programmable gate array, a microprocessor, a microcontroller, or a digital application-specific integrated circuit (ASIC). In some embodiments, by using a relatively small second-order RC structure for zeros at the input and a zero using the DFE cap, the proposed architecture saves layout area that would have been spent on large frequency enhancement capacitances in amplifier stages and programmable resistive DACs for DFE offsets.

Any apparatus described herein may be modeled and simulated using EDA tools. Some embodiments, then, rather than being physical circuits, are non-transitory computer-readable media comprising instructions that, when executed by one or more processors of a computing device, cause the computing device to generate a circuit design by configuring the computing device to perform operations comprising configuring circuit elements within a model circuit design file as part of a circuit design. Such circuit design files are further used to model operation in accordance with some embodiments.

Figure 8:
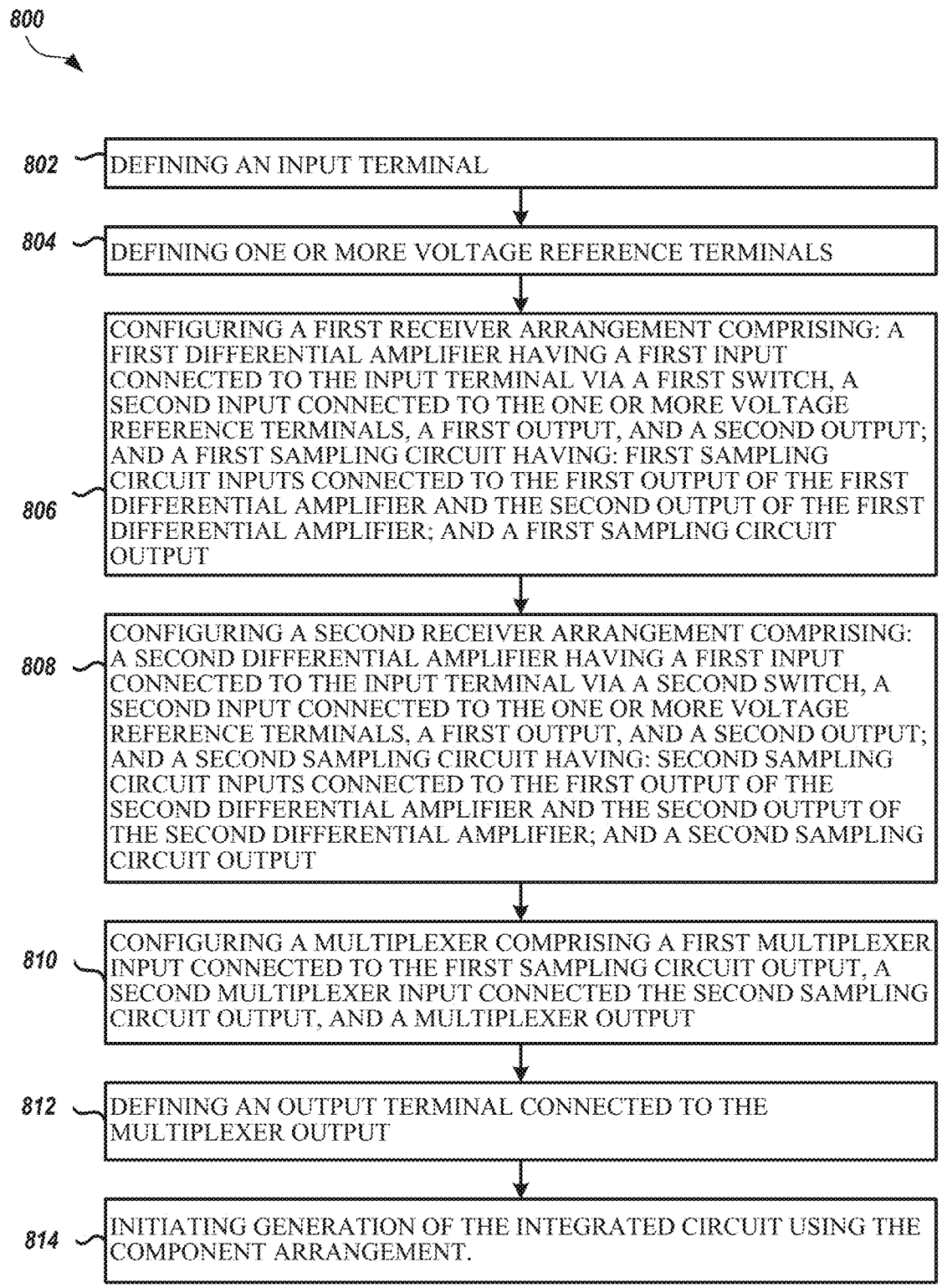
FIG. 8 illustrates aspects of an example method for generating a receiver in accordance with some embodiments.

FIG. 8 illustrates aspects of an example method for generating a receiver in accordance with some embodiments. In some embodiments, method 800 of FIG. 8 may be performed by a machine or an EDA computing device, using automation and/or inputs received at the system to generate a component arrangement within EDA software which may then be used to fabricate or initiate fabrication of an integrated circuit. In some embodiments, method 800 may be embodied by instructions stored in a storage medium or in a non-transitory storage device which, when executed by one or more processors of a machine (e.g. an EDA computing device), cause the machine to perform the operations of method 800.

Method 800 may be considered a method of configuring a component arrangement in design for an integrated circuit, and begins with operation 802 involving defining an input terminal, and then in operation 804 defining one or more voltage reference terminals. One or more receiver arrangements may be configured and connected to the input and voltage reference terminals. In the example of method 800, this occurs for a first receiver arrangement in operation 806 of configuring a first receiver arrangement comprising a first differential amplifier having a first input connected to the input terminal via a first switch, a second input connected to the one or more voltage reference terminals, a first output, and a second output; and a first sampling circuit having: first sampling circuit inputs connected to the first output of the first differential amplifier and the second output of the first differential amplifier; and a first sampling circuit output.

At least one other receiver arrangement is configured in operation 806 by configuring a second receiver arrangement comprising a second differential amplifier having a first input connected to the input terminal via a second switch, a second input connected to the one or more voltage reference terminals, a first output, and a second output; a second sampling circuit having: second sampling circuit inputs connected to the first output of the second differential amplifier and the second output of the second differential amplifier: and a second sampling circuit output. In various embodiments as described above, any number of additional receiver arrangements may also be configured, with various particular stages for the amplifiers of each receiver arrangement.

A multiplexer is configured in operation 810 with a first multiplexer input connected to the first sampling circuit output, a second multiplexer input connected the second sampling circuit output, and a multiplexer output. An output terminal is defined in operation 812, with the output terminal connected to the multiplexer output. The component arrangement defined and generated in the above operations is then used to fabricate (e.g. generate) or initiate generation of an integrated circuit using the component arrangement. In various embodiments, various devices, systems, and methods are used to fabricate devices based on the updated circuit design. In some embodiments, this includes generation of masks, and the use of machinery for circuit fabrication. In various implementations, files generated by embodiments described herein are used to create photolithographic masks for lithography operations used to generate circuits according to a circuit design, where a pattern defined by the masks is used in applying a thin uniform layer of viscous liquid (photo-resist) on the wafer surface. The photo-resist is hardened by baking and then selectively removed by projection of light through a reticle containing mask information. In some implementations, the files are further used for etching patterning, where unwanted material from the surface of the wafer is removed according to details described in the design files, where a pattern of the photo-resist is transferred to the wafer by means of etching agents. In some embodiments, aspects of design files generated according to the operations described herein are used for deposition operations, where films of the various materials are applied on the wafer. This may involve physical vapor deposition (PVD), chemical vapor deposition (CVD) or any such similar processes. Some embodiments may use files generated according to operations described herein for chemical mechanical polishing, where a chemical slurry with etchant agents is used to planarize to the wafer surface; for oxidation where dry oxidation or wet oxidation molecules convert silicon layers on top of the wafer to silicon dioxide; for ion implantation where dopant impurities are introduced into a semiconductor using a patterned electrical field; or for diffusion where bombardment-induced lattice defects are annealed. Thus, in various embodiments, systems and operations include not only computing devices for generating updated circuit design files, but also hardware systems for fabricating masks, controlling IC fabrication hardware, and the hardware and operations for fabricating a circuit from a circuit design (e.g. component arrangement) generated in accordance with various embodiments described herein.

Additionally, it will be apparent that any apparatus or operations described herein in accordance with various embodiments may be structured with intervening, repeated, or other elements while still remaining within the scope of the contemplated embodiments. Some embodiments may include multiple receivers, along with any other circuit elements. Some embodiments may function with described operating modes as well as other operating modes. The various embodiments described herein are thus presented as examples, and do not exhaustively describe every possible implementation in accordance with the possible embodiments.

Figure 9:
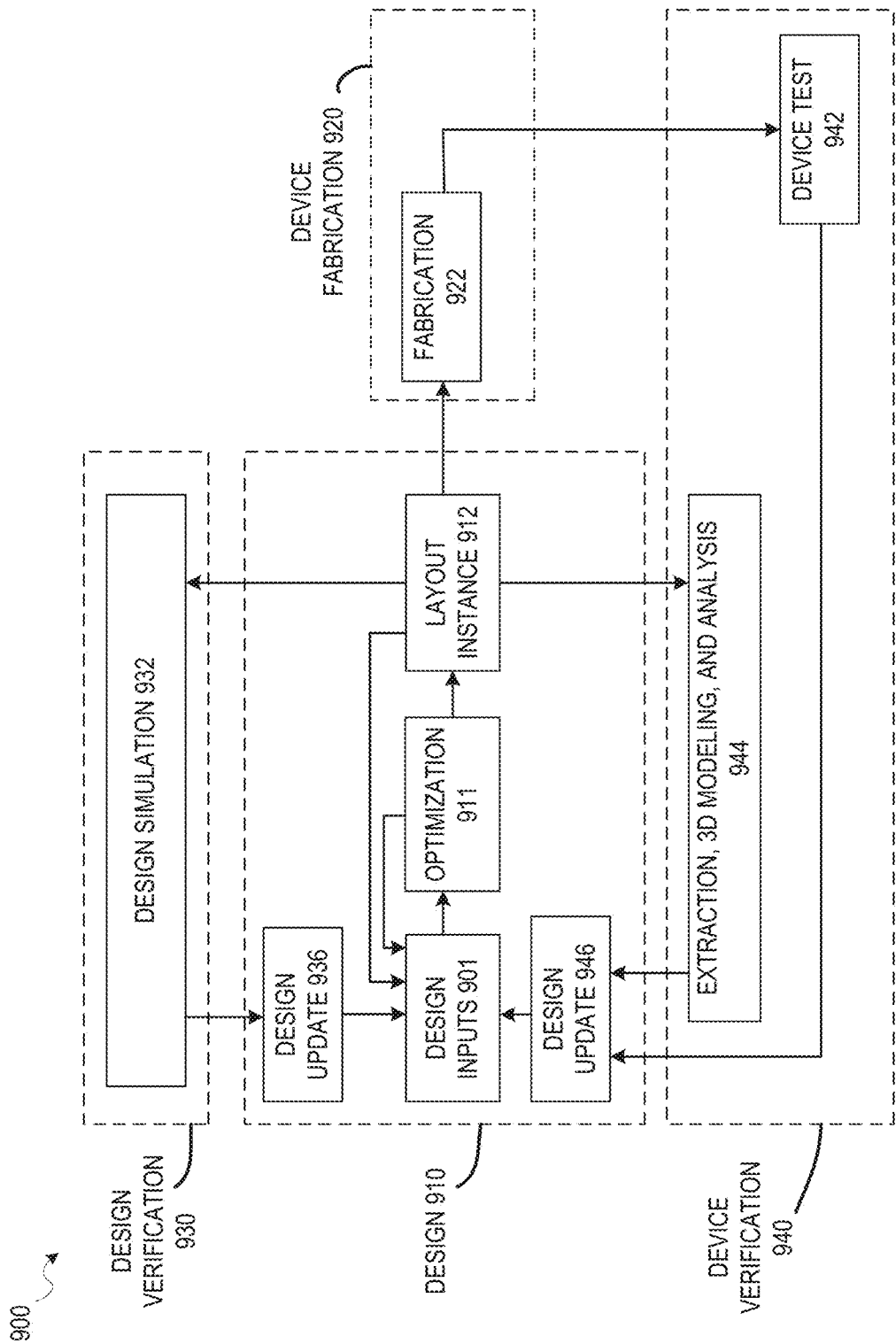
FIG. 9 is a diagram illustrating an example design process flow for generating a circuit including embodiments to implement receiver circuits to interface a microprocessor with memory, in accordance with some embodiments.

FIG. 9 is a diagram illustrating one possible design process flow for generating a circuit including embodiments to implement receiver circuits to interface a microprocessor with memory, in accordance with some embodiments. As illustrated, the overall design flow 900 includes a design phase 910, a device fabrication phase 920, a design verification phase 930, and a device verification phase 940. The design phase 910 involves an initial design input operation 901 where the basic elements and functionality of a device are determined, as well as revisions based on various analyses and optimization of a circuit design. This design input operation 901 is where instances of a design arrangement are used in the design and any additional circuitry is selected. The initial strategy, tactics, and context for the device to be created are also generated in the design input operation 901, depending on the particular design algorithm to be used.

In some embodiments, following an initial selection of design values in the design input operation 901, timing analysis and optimization, according to various embodiments, occurs in an optimization operation 911, along with any other automated design processes. One such process may be the automated design of control circuitry to switch a DDR programmable level translator device depending on the type of DDR memory being accessed. As described below, design constraints for arrangements of a circuit design generated with design inputs in the design input operation 901 may be analyzed using hierarchical timing analysis according to various embodiments. While the design flow 900 shows such optimization occurring prior to a layout instance 912, such hierarchical timing analysis and optimization may be performed at any time to verify operation of a circuit design. For example, in various embodiments, constraints for arrangements in a circuit design may be generated prior to routing of connections in a circuit design, after routing, during register transfer level (RTL) operations, or as part of a final signoff optimization or verification prior to a device fabrication operation 922.

After design inputs are used in the design input operation 901 to generate a circuit layout, and any optimization operations 911 are performed, a layout is generated in the layout instance 912. The layout describes the physical layout dimensions of the device that match the design inputs. This layout may then be used in a fabrication operation 922 to generate a device, or additional testing and design updates may be performed using designer inputs or automated updates based on design simulation 932 operations or three-dimensional structure modeling and analysis 944 operations. Once the device is generated, the device can be tested as part of device test 942 operations, and layout modifications generated based on actual device performance.

As described in more detail below, design updates 936 from design simulation 932 operations, design updates 946 from device test 942 or 3D modeling and analysis 944 operations, or a direct design input operation 901 may occur after an initial layout instance 912 is generated. In various embodiments, whenever design inputs are used to update or change an aspect of a circuit design, a timing analysis and optimization operation 911 may be performed.

For example, in various embodiments, a user may provide an input to an EDA computing device indicating placement of an instance of a design arrangement within a first portion of a circuit design. Once a design is ready, another input to the EDA computing device may be used to generate constraints for each instance of the design arrangement, and a timing analysis may be performed using the constraints. An output to a display of the EDA computing device may show results of the timing analysis, or may show optimizations recommended or automatically perform adjustments to the circuit design based on the timing analysis. Further inputs to the EDA computing device may involve adjustments as user design inputs, with additional timing analysis and optimization initiated via user operation of the EDA computing device.

Figure 10:
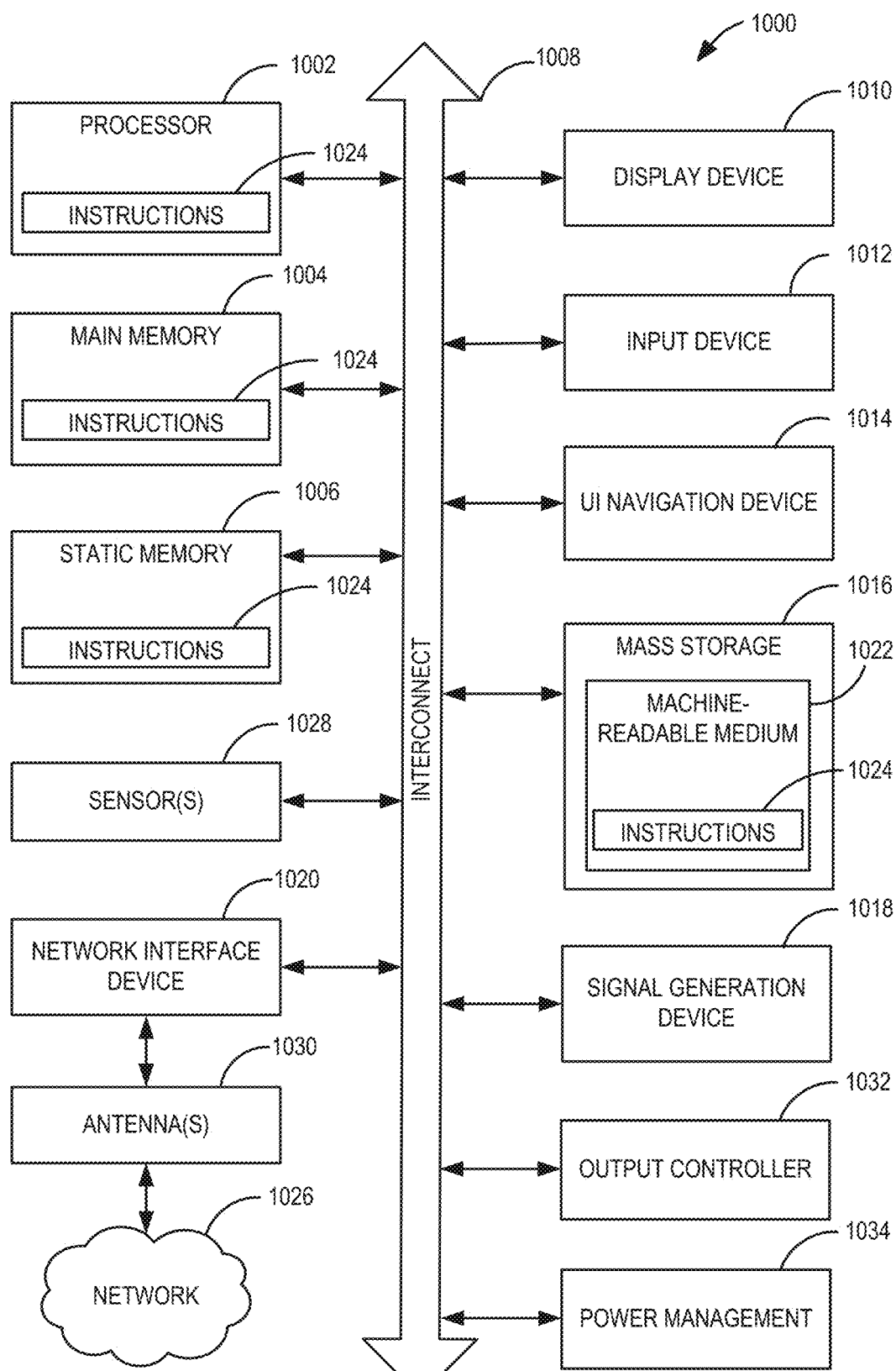
FIG. 10 is an arrangement diagram illustrating an example computer system machine upon which any one or more of the methodologies herein discussed can be run.

FIG. 10 is an arrangement diagram illustrating an example computer system machine 1000 upon which any one or more of the methodologies herein discussed can be run. The computer system machine 1000 or elements of the computer system machine 1000 may be used to implement any device, a mobile phone, tablet, laptop wireless access point, wireless station device, or any other such device described herein. In various other embodiments, different device components or multiples of any element may be used in different devices. Some embodiments may involve the use of a computer system machine 1000 running electronic design automation tools to aid in the design and creation of hardware systems. In various alternative embodiments, the computer system machine 1000 operates as a standalone device or can be connected (e.g., networked) to other machines. In a networked deployment, the computer system machine 1000 can operate in the capacity of either a server or a client machine in server-client network environments, or it can act as a peer machine in peer-to-peer (or distributed)

network environments. The computer system machine 1000 can be a personal computer (PC) that may or may not be portable (e.g., a notebook or a netbook), a tablet, a set-top box (STB), a gaming console, a personal digital assistant (PDA), a mobile telephone or smartphone, a web appliance, a network router, a network switch, a network bridge, or any machine capable of executing instructions (sequential or otherwise) that specify actions to be taken by that machine. Further, while only a single computer system machine 1000 is illustrated, the term "machine" shall also be taken to include any collection of machines that individually or jointly execute a set (or multiple sets) of instructions to perform any one or more of the methodologies discussed herein.

The example computer system machine 1000 includes a processor 1002 (e.g., a central processing unit (CPU), a graphics processing unit (GPU), or both), a main memory 1004, and a static memory 1006, which communicate with each other via an interconnect 1008 (e.g., a link, a bus, etc.). The computer system machine 1000 can further include a display device 1010, an alphanumeric input device 1012 (e.g., a keyboard), and a user interface (UI) navigation device 1014 (e.g., a mouse). In one embodiment, the display device 1010, input device 1012, and UI navigation device 1014 are a touch screen display. The computer system machine 1000 can additionally include a storage device 1016 (e.g., a drive unit), a signal generation device 1018 (e.g., a speaker), an output controller 1032, a power management controller 1034, a network interface device 1020 (which can include or operably communicate with one or more antennas 1030, transceivers, or other wireless communications hardware), and one or more sensors 1028, such as a Global Positioning System (GPS) sensor, compass, location sensor, accelerometer, or other sensor.

The storage device 1016 includes a machine-readable medium 1022 on which is stored one or more sets of data structures and instructions 1024 (e.g., software) embodying or utilized by any one or more of the methodologies or functions described herein. The instructions 1024 can also reside, completely or at least partially, within the main memory 1004, within the static memory 1006, and/or within the processor 1002 during execution thereof by the computer system machine 1000, with the main memory 1004, the static memory 1006, and the processor 1002 also constituting machine-readable media 1022.

While the machine-readable medium 1022 is illustrated in an example embodiment to be a single medium, the term "machine-readable medium" can include a single medium or multiple media (e.g., a centralized or distributed database, and/or associated caches and servers) that store the one or more instructions 1024. The term "machine-readable medium" shall also be taken to include any tangible medium that is capable of storing, encoding, or carrying the instructions 1024 for execution by the computer system machine 1000 and that cause the computer system machine 1000 to perform any one or more of the methodologies of the present disclosure or that is capable of storing, encoding, or carrying data structures utilized by or associated with such instructions 1024.

Various techniques, or certain aspects or portions thereof, may take the form of program code (i.e., instructions 1024) embodied in tangible media, such as floppy diskettes, CD-ROMs, hard drives, a non-transitory computer-readable storage medium, or any other machine-readable storage medium therein, when the program code is loaded into and executed by a machine, such as a computer, the machine becomes an apparatus for practicing the various techniques. In the case of program code execution on programmable computers, the computing device may include a processor 1002, a storage medium readable by the processor 1002 (including volatile and non-volatile memory and/or storage elements), at least one input device 1012, and at least one output device. The volatile and non-volatile memory and/or storage elements may be a RAM, erasable programmable read only memory (EPROM), flash drive, optical drive, magnetic hard drive, or other medium for storing electronic data. One or more programs that may implement or utilize the various techniques described herein may use an application programming interface (API), reusable controls, and the like. Such programs may be implemented in a high-level procedural or object-oriented programming language to communicate with a computer system. However, the program(s) may be implemented in assembly or machine language, if desired. In any case, the language may be a compiled or interpreted language, and combined with hardware implementations.

The embodiments described above can be implemented in one or a combination of hardware, firmware, and software. Various methods or techniques, or certain aspects or portions thereof, can take the form of program code (i.e., instructions 1024) embodied in tangible media, such as flash memory, hard drives, portable storage devices, read-only memory (ROM), RAM, semiconductor memory devices (e.g., EPROM, electrically erasable programmable read-only memory (EEPROM)), magnetic disk storage media, optical storage media, and any other machine-readable medium 1022 or storage device 1016 wherein, when the program code is loaded into and executed by a computer system machine 1000, such as a computer or networking device, the computer system machine 1000 becomes an apparatus for practicing the various techniques.

A machine-readable medium 1022 or other storage device 1016 can include any non-transitory mechanism for storing information in a form readable by a computer system machine 1000 (e.g., a computer).

It should be understood that the functional units or capabilities described in this specification can have been referred to or labeled as components or modules, in order to more particularly emphasize their implementation independence. For example, a component or module can be implemented as a hardware circuit comprising custom very-large-scale integration (VLSI) circuits or gate arrays, off-the-shelf semiconductors such as logic chips, transistors, or other discrete components. A component or module can also be implemented in programmable hardware devices such as field-programmable gate arrays, programmable array logic, programmable logic devices, or the like. Components or modules can also be implemented in software for execution by various types of processors. An identified component or module of executable code can, for instance, comprise one or more physical or logical arrangements of computer instructions 1024, which can, for instance, be organized as an object, procedure, or function. Nevertheless, the executables of an identified component or module need not be physically located together, but can comprise disparate instructions 1024 stored in different locations, which, when joined logically together, comprise the component or module and achieve the stated purpose for the component or module.

Indeed, a component or module of executable code can be a single instruction, or many instructions 1024, and can even be distributed over several different code segments, among different programs, and across several memory devices. Similarly, operational data can be identified and illustrated herein within components or modules, and can be embodied in any suitable form and organized within any suitable type of data structure. The operational data can be collected as a single data set, or can be distributed over different locations including over different storage devices 1016, and can exist, at least partially, merely as electronic signals on a system or network. The components or modules can be passive or active, including agents operable to perform desired functions.

We claim:

1. A receiver apparatus for a memory device, the receiver apparatus comprising:
   an input terminal;
   one or more voltage reference terminals;
   a first receiver arrangement comprising:
      a first differential amplifier including a first input connected to the input terminal via a first switch, a second input connected to the one or more voltage reference terminals, a first output, and a second output; and
      a first sampling circuit including first sampling circuit inputs connected to the first output of the first differential amplifier and the second output of the first differential amplifier, and a first sampling circuit output;
   a second receiver arrangement comprising:
      a second differential amplifier including a first input connected to the input terminal via a second switch, a second input connected to the one or more voltage reference terminals, a first output, and a second output; and
      a second sampling circuit including second sampling circuit inputs connected to the first output of the second differential amplifier and the second output of the second differential amplifier, and a second sampling circuit output;
   a multiplexer including a first multiplexer input connected to the first sampling circuit output, a second multiplexer input connected the second sampling circuit output, and a multiplexer output; and
   an output terminal connected to the multiplexer output.

2. The receiver apparatus of claim 1, wherein the first receiver arrangement comprises a second switch of the first receiver arrangement configured to couple the first input to the second input via a first reference capacitor during a first autozero operation; and wherein the second receiver arrangement comprises a second switch of the second receiver arrangement configured to couple a third input to a fourth input via a second reference capacitor during a second autozero operation.

3. The receiver apparatus of claim 2, comprising control circuitry configured to initiate the first autozero operation while the second receiver arrangement is amplifying data from a datastream, and to initiate the second autozero operation while the first receiver arrangement is amplifying the data from the datastream, such that the multiplexer continuously outputs the datastream as received from the first receiver arrangement, the second receiver arrangement, or both the first receiver arrangement and the second receiver arrangement.

4. The receiver apparatus of claim 3, wherein each bit of the datastream is on a cycle of approximately 55 picoseconds.

5. The receiver apparatus of claim 4, wherein the first receiver arrangement and the second receiver arrangement each perform an associated autozero operation every 10 nanoseconds.

6. The receiver apparatus of claim 2, comprising control circuitry for decision feedback equalization (DFE) of each of a plurality of receiver arrangements, the plurality of receiver arrangements comprising at least the first receiver arrangement and the second receiver arrangement.

7. The receiver apparatus of claim 6, wherein the first differential amplifier comprises a three-stage differential amplifier, each stage of the first differential amplifier comprising:
   a first field-effect transistor (FET) and a second FET, with a differential input at gates of the first and second FETs; and
   a differential output at drains of the first and second FETs;
   wherein the drains are each connected to a power voltage (VDD) via an associated resistor element.

8. The receiver apparatus of claim 7, wherein the first differential amplifier comprises:
   a first Miller compensation capacitance coupled, via first one or more switches, from a drain of the first FET of a first stage of the three-stage differential amplifier to the drain of the first FET of a second stage of the three-stage differential amplifier; and
   a second Miller compensation capacitance coupled, via second one or more switches, from the drain of the second FET of the first stage of the three-stage differential amplifier to the drain of the second FET of the second stage of the three-stage differential amplifier.

9. The receiver apparatus of claim 6, comprising associated differential amplifiers for the plurality of receiver arrangements, the plurality of receiver arrangements each comprising the first receiver arrangement and the second receiver arrangement;
   wherein the associated differential amplifier of each receiver arrangement of the plurality of receiver arrangements comprises a plurality of stages of a multi-stage differential amplifier, each multi-stage differential amplifier comprising at least:
   a first stage; and
   an output stage.

10. The receiver apparatus of claim 9, wherein each multi-stage differential amplifier further comprises one or more intermediate stages between the first stage and the output stage; and
    wherein the first stage comprises:
    a first field-effect transistor (FET) and a second FET with a differential input at gates of the first and second FETs;
    a first programmable resistor element coupled from a drain of the first FET to a power voltage (VDD);
    a second programmable resistor element coupled from a drain of the second FET to the VDD;
    a third programmable resistor element coupled from a source of the first FET to a source of the second FET;
    a source capacitor element coupled from the source of the first FET to the source of the second FET;
    a first current source coupled from the source of the first FET to a ground;
    a second current source coupled from the source of the second FET to the ground; and
    a differential output at the drains of the first and second FETs;
    wherein the drains are each connected to the VDD via an associated resistor element.

11. The receiver apparatus of claim 10, wherein the plurality of receiver arrangements comprises at least the first receiver arrangement, the second receiver arrangement, and a third receiver arrangement;

wherein the control circuitry performs decision feedback equalization (DFE) by selecting a datastream from a selected receiver arrangement of the plurality of receiver arrangements that is not performing an autozero operation based on selected resistor values of the first, second, and third programmable resistor elements of the selected receiver arrangement.

12. The receiver apparatus of claim 9, wherein the first differential amplifier further comprises a plurality of nested Miller compensation capacitances connected between corresponding outputs and inputs of the plurality of stages of the first differential amplifier via associated switches, such that the nested Miller compensation capacitances are connected during the first autozero operation to stabilize the first differential amplifier;

wherein a first Miller compensation capacitance of the plurality of nested Miller compensation capacitances is coupled, via first one or more switches, from a drain of a first FET of the first stage of the three-stage differential amplifier to the drain of the first FET of a second stage of the three-stage differential amplifier; and wherein a second Miller compensation capacitance is coupled, via second one or more switches, from the drain of the second FET of the first stage of the three-stage differential amplifier to the drain of the second FET of the second stage of the three-stage differential amplifier.

13. The receiver apparatus of claim 6, wherein the plurality of receiver arrangements comprise at least the first receiver arrangement, the second receiver arrangement, and a third receiver arrangement;

wherein the one or more voltage reference terminals comprise a first voltage reference terminal at a first voltage and a second voltage reference terminal at a second voltage different from the first voltage; and wherein the control circuitry performs decision feedback equalization (DFE) by selecting a datastream from a selected receiver arrangement of the plurality of receiver arrangements that is not performing an autozero operation based on a selected reference voltage from the one or more voltage reference terminals coupled to the selected receiver arrangement.

14. A method of configuring a component arrangement in design for an integrated circuit, the method comprising:

defining an input terminal;

defining one or more voltage reference terminals;

configuring a first receiver arrangement comprising:
a first differential amplifier including a first input connected to the input terminal via a first switch, a second input connected to the one or more voltage reference terminals, a first output, and a second output; and
a first sampling circuit including first sampling circuit inputs connected to the first output of the first differential amplifier and the second output of the first differential amplifier, and a first sampling circuit output;

configuring a second receiver arrangement comprising:
a second differential amplifier including a first input connected to the input terminal via a second switch, a second input connected to the one or more voltage reference terminals, a first output, and a second output; and
a second sampling circuit including second sampling circuit inputs connected to the first output of the second differential amplifier and the second output of the second differential amplifier, and a second sampling circuit output;

configuring a multiplexer including a first multiplexer input connected to the first sampling circuit output, a second multiplexer input connected the second sampling circuit output, and a multiplexer output;

defining an output terminal connected to the multiplexer output; and initiating generation of a design for the integrated circuit using the component arrangement.

15. The method of claim 14, wherein the first differential amplifier comprises a three-stage differential amplifier, each stage of the first differential amplifier comprising:

a first field-effect transistor (FET) and a second FET, with a differential input at gates of the first and second FETs; and a differential output at drains of the first and second FETs, wherein the drains are each connected to a power voltage (VDD) via an associated resistor element; and wherein the first differential amplifier further comprises:
a first Miller compensation capacitance coupled, via first one or more switches, from a drain of the first FET of a first stage of the three-stage differential amplifier to the drain of the first FET of a second stage of the three-stage differential amplifier; and
a second Miller compensation capacitance coupled, via second one or more switches, from the drain of the second FET of the first stage of the three-stage differential amplifier to the drain of the second FET of the second stage of the three-stage differential amplifier.

16. The method of claim 14, wherein the first receiver arrangement comprises a second switch of the first receiver arrangement configured to couple the first input to the second input via a first reference capacitor during a first autozero operation; and wherein the second receiver arrangement comprises a second switch of the second receiver arrangement configured to couple a third input to a fourth input via a second reference capacitor during a second autozero operation.

17. The method of claim 16, further comprising:

configuring control circuitry that is configured to initiate the first autozero operation while the second receiver arrangement is amplifying data from a datastream, and to initiate the second autozero operation while the first receiver arrangement is amplifying the data from the datastream, such that the multiplexer continuously outputs the datastream as received from the first receiver arrangement, the second receiver arrangement, or both the first receiver arrangement and the second receiver arrangement.

18. The method of claim 17, wherein each bit of the datastream is on a cycle of approximately 55 picoseconds.

19. The method of claim 18, wherein the first receiver arrangement and the second receiver arrangement each perform an associated autozero operation every 10 nanoseconds.

20. The method of claim 16, further comprising:

configuring control circuitry for decision feedback equalization (DFE) of each of a plurality of receiver arrangements, the plurality of receiver arrangements comprising at least the first receiver arrangement and the second receiver arrangement.

* * * * *